United States Patent
Son et al.

(10) Patent No.: US 9,705,106 B2
(45) Date of Patent: Jul. 11, 2017

(54) FLEXIBLE ORGANIC LIGHT EMITTING DISPLAY

(71) Applicant: LG DISPLAY CO., LTD., Seoul (KR)

(72) Inventors: Hae Joon Son, Paju-si (KR); Joung Ho Ryu, Seoul (KR); Sie Hyug Choi, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/830,475

(22) Filed: Aug. 19, 2015

(65) Prior Publication Data

US 2016/0155985 A1    Jun. 2, 2016

(30) Foreign Application Priority Data

Nov. 28, 2014   (KR) .................. 10-2014-0168244

(51) Int. Cl.
| | | |
|---|---|---|
| *H01L 27/32* | (2006.01) | |
| *H01L 51/52* | (2006.01) | |
| *H01L 51/00* | (2006.01) | |
| *H01L 51/56* | (2006.01) | |

(52) U.S. Cl.
CPC ...... *H01L 51/5253* (2013.01); *H01L 27/3276* (2013.01); *H01L 51/003* (2013.01); *H01L 51/0097* (2013.01); *H01L 51/5246* (2013.01); *H01L 51/56* (2013.01); *H01L 2227/323* (2013.01); *H01L 2251/301* (2013.01); *H01L 2251/5338* (2013.01); *H01L 2251/558* (2013.01); *Y02E 10/549* (2013.01)

(58) Field of Classification Search
CPC ..... H01L 27/32; H01L 51/52; H01L 27/3241; H01L 27/3276; H01L 51/0097; H01L 51/5246; H01L 51/5253
See application file for complete search history.

(56) References Cited

U.S. PATENT DOCUMENTS

| | | | |
|---|---|---|---|
| 2003/0034497 A1 | 2/2003 | Yamazaki et al. | |
| 2008/0303976 A1* | 12/2008 | Nishizawa | G02F 1/133305 349/64 |
| 2009/0051640 A1* | 2/2009 | Tanaka | G02F 1/136286 345/92 |
| 2010/0308335 A1* | 12/2010 | Kim | H01L 27/3244 257/59 |
| 2011/0227215 A1* | 9/2011 | Kim | H01L 23/4985 257/734 |
| 2014/0134763 A1 | 5/2014 | Park et al. | |
| 2014/0141547 A1 | 5/2014 | Kim | |

(Continued)

FOREIGN PATENT DOCUMENTS

KR    10-2013-0036843 A    4/2013

*Primary Examiner* — Phuc Dang
(74) *Attorney, Agent, or Firm* — Dentons US LLP

(57) ABSTRACT

A flexible organic light emitting display and a method of fabricating the same are disclosed in which flexible organic light emitting display may be realized without a plastic based substrate, and at the same time an ideal WVTR characteristic level for stably driving an organic light emitting element without deterioration may be realized. The flexible organic light emitting display comprises a first ultra-thin film glass substrate that includes aluminum silicide; a thin film transistor (TFT) device arranged on the first ultra-thin film glass substrate; and an organic light emitting element arranged on the TFT element.

18 Claims, 5 Drawing Sheets

(56) References Cited

U.S. PATENT DOCUMENTS

| | | | |
|---|---|---|---|
| 2014/0323006 A1 | 10/2014 | Song et al. | |
| 2015/0086740 A1* | 3/2015 | Shin | C09J 7/0239 |
| | | | 428/41.8 |
| 2015/0179722 A1* | 6/2015 | Koo | H01L 27/3258 |
| | | | 257/40 |
| 2015/0382474 A1* | 12/2015 | Liu | B32B 7/12 |
| | | | 29/832 |

* cited by examiner

FLEXIBLE ORGANIC LIGHT EMITTING DISPLAY

CROSS REFERENCE TO RELATED APPLICATIONS

This application claims the benefit of the Korean Patent Application No. 10-2014-0168244 filed on Nov. 28, 2014, which is hereby incorporated by reference for all purposes as if fully set forth herein.

BACKGROUND OF THE INVENTION

Field of the Invention

The present invention relates to a flexible organic light emitting display. More particularly, the present invention relates to a flexible organic light emitting display that includes a thin film transistor (TFT) driving device formed on an ultra-thin film glass substrate and an organic light emitting element, and a method of fabricating the same.

Discussion of the Related Art

An organic light emitting display (OLED) is a self-light emitting display device, and may be fabricated to have a lightweight and slim size because it does not need a separate light source, as in a liquid crystal display (LCD). Also, the organic light emitting display is favorable with respect to power consumption due to low driving voltage and also is excellent for color realization, response speed, viewing angle, and contrast ratio (CR). As a result, the organic light emitting display has been studied as a next-generation display.

Particularly, studies of a flexible organic light emitting display (flexible OLED), which may be bent or unbent, or may be folded or unfolded, so as to be used for various applications, have been actively made. In case of such a flexible organic light emitting display, a plastic based substrate such as polyimide (PI) may be used to realize a flexible substrate.

Since the organic light emitting display uses an organic material which is a compound of a conjugated molecular structure as a light emitting layer, a serious problem occurs in that the organic light emitting layer is highly sensitive to oxygen and water. Thus, deteriorating the device. Deterioration of the organic light emitting layer due to oxygen and water could lead to deterioration of lifetime of the organic light emitting display. For this reason, the organic light emitting display should encapsulate the organic light emitting element that includes the organic light emitting layer. At this time, in order that deterioration caused by oxygen and water of the organic light emitting layer does not cause a defect of the organic light emitting display, it is known that a water vapor transmission rate (WVTR) value of an encapsulation member should be 10-6 g/m2·day or less. That is, it is known that a barrier characteristic level required by the organic light emitting display has a WVTR value of 10-6 g/m2·day or less. To this end, the organic light emitting element is protected by a substrate having a low WVTR value or an encapsulation member of various materials.

However, the plastic based substrate used to realize the flexible organic light emitting display has a WVTR value that is relatively higher than that of a glass substrate having a perfect WVTR characteristic. That is, oxygen and water do not pass through the glass substrate, whereas oxygen and water could pass through the plastic based substrate relatively easily. Therefore, if the organic light emitting display is fabricated using the plastic based substrate, oxygen and water are easily permeated into the organic light emitting element. This becomes the most important defect factor in the organic light emitting display that uses a plastic based substrate.

Therefore, efforts for solving water permeation in a plastic substrate based flexible organic light emitting display have been made in such a manner that barrier layers, which are bendable while preventing oxygen and water from being permeated between organic light emitting element including an organic light emitting layer and an upper substrate and between the organic light emitting element and a lower substrate, are formed. One of the efforts is a thin film encapsulation technique that alternately deposits an inorganic film and an organic film on the organic light emitting element that includes the organic light emitting layer. For example, a technique of the Korean Patent Application No. 10-2011-0101016 has been provided, in which a multi-buffer layer is provided between an organic light emitting layer and a plastic based substrate and has a structure that an inorganic layer of SiOx and an inorganic layer of SiNx are deposited alternately.

PRIOR ART REFERENCE

1. Flexible OLED device (Korean Patent Application No. 10-2011-0101016)

According to the related art including the disclosure disclosed in Korean Patent Application No. 10-2011-0101016, the following problems occur.

The thinner the organic light emitting display is, the more improved flexibility the flexible organic light emitting display has. Therefore, if a thickness of a thin film encapsulation is thin, flexibility of the flexible organic light emitting display is improved. However, if a plastic based substrate is used, the multi-buffer layer should be formed at a thickness of at least 0.7 μm or more to reach a barrier characteristic level required by the flexible organic light emitting display. However, to improve flexibility of the flexible organic light emitting display, it is preferable that the thickness of the multi-buffer layer is thin. That is, as far as the plastic based substrate is used in the flexible organic light emitting display, flexibility and barrier characteristic have a trade-off relationship.

In other words, as far as the plastic based substrate is used in the flexible organic light emitting display, barrier layers should be provided at a thickness of several micrometers to several tens of micrometers to ideally prevent water permeation from occurring. This may result in a structure that goes against a desired slim size of the organic light emitting display. In addition, as barrier layers of different refractive indexes are deposited, a new problem occurs in that optical conditions should be considered. In this respect, the design and manufacturing of the barrier layers becomes very complicated.

SUMMARY OF THE INVENTION

Accordingly, the present invention is directed to a flexible organic light emitting display and a method of fabricating the same, which substantially obviates one or more problems due to limitations and disadvantages of the related art.

An advantage of the present invention is to provide a flexible organic light emitting display, which includes a thin film transistor (TFT) driving device formed on an ultra-thin film glass substrate, or of other material excluding plastic, and an organic light emitting element, and a method of fabricating the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a flexible organic light emitting display according to the embodiment of the present invention comprises a first ultra-thin film glass substrate including aluminum silicide; a thin film transistor (TFT) device arranged on the first ultra-thin film glass substrate; and an organic light emitting element arranged on the TFT element.

In another aspect of the present invention, a method of fabricating a flexible organic light emitting display comprises the steps of bonding a carrier glass substrate and a first ultra-thin film glass substrate to each other by overlapping so that a boundary surface where a corner of the carrier glass substrate and a corner of the first ultra-thin film glass substrate are directly in contact with each other exists and at the same time an aluminum based inorganic layer is arranged between the carrier glass substrate and the first ultra-thin film glass substrate; heating the bonded carrier glass substrate and first ultra-thin film glass substrate at a high temperature; forming a TFT element and an organic light emitting element on the first ultra-thin film glass substrate; and detaching the carrier glass substrate and the first ultra-thin film glass substrate from each other by cutting the carrier glass substrate, the first ultra-thin film glass substrate and the aluminum based inorganic layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
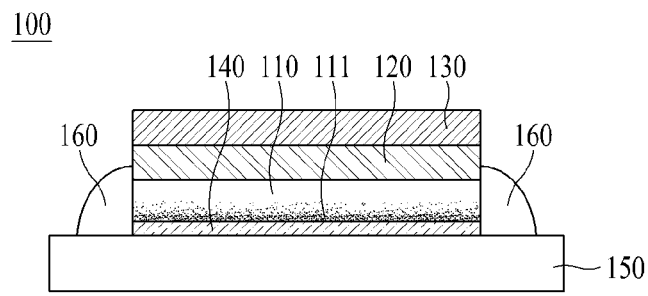
FIGS. 1 to 3 are cross-sectional views briefly illustrating a flexible organic light emitting display according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details.

Like reference numerals refer to like elements throughout the specification.

In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used.

The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

If an element (first element) is 'connected', 'combined' or 'accessed' to another element (second element) in this specification, it is to be understood that the first element may directly be connected to the second element but a third element may be interposed between the first element and the second element and the first and second element may be connected to each other through the third element.

It will be understood that, although the terms "first", "second", "A", "B", "(a)", "(b)", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

The flexible organic light emitting display according to the various embodiments of the present invention will be described with reference to the accompanying drawings. In the drawings, various layers which are elements of the flexible organic light emitting display according to the present invention are expressed in a shape of rectangle for convenience. Although front sides and lateral sides of the various layers are seen to be clearly identified from one another, the front sides and the lateral sides may actually have a slow curved type without being clearly identified from one another.

Hereinafter, the organic light emitting display and the method of fabricating the same according to the embodiment of the present invention will be described in detail with reference to the accompanying drawings.

FIG. 1 is a cross-sectional view briefly illustrating a flexible organic light emitting display 100 according to an embodiment of the present invention.

As shown in FIG. 1, the flexible organic light emitting display 100 according to the embodiment of the present invention includes a first ultra-thin film glass substrate 110 corresponding to a lower substrate of the flexible organic light emitting display, a TFT element 120 arranged on the first ultra-thin film glass substrate 110, and an organic light emitting element 130 arranged on the TFT element 120.

The first ultra-thin film glass substrate 110 is a glass substrate having a very thin thickness of 10 μm to 100 μm. Since the glass substrate has low elasticity and is likely to be broken or damaged, implementations of using a glass substrate as a substrate of a flexible organic light emitting display has been excluded in the art. It is known that a glass substrate having a thickness of 50 μm generally has a maximum curvature radius of 50 mm. In this case, the maximum curvature radius of the glass substrate denotes a curvature radius when the glass substrate is bent physically to the maximum range without being broken if bending stress is given to the glass substrate at gradually high strength. Although the maximum curvature radius of the glass substrate becomes smaller as the thickness of the glass substrate becomes thinner, if bending stress at a strength of a certain level or more is given to the glass substrate, the glass substrate is broken unconditionally. Therefore, even though the glass substrate is fabricated at a thin thickness, it is known that the thin glass substrate has no great effect on increasing the flexibility of the substrate.

However, in the flexible organic light emitting display 100 according to the embodiment of the present invention, the first ultra-thin film glass substrate 110 which is a very thin glass substrate of 40 μm (or other material substrate having appropriate characteristics) has been used. When a first adhesive layer 140 of 25 μm (or other functional film or layer having appropriate characteristics) and a plastic protective film 150 of 38 μm (or other functional film or layer having appropriate characteristics), which will be described later, are bonded (or otherwise attached) with the first ultra-thin film glass substrate 110 of 40 μm, a maximum curvature radius value of 3 mm is obtained. That is, the first ultra-thin film glass substrate 110 bonded with the first adhesive layer 140 and the plastic protective film 150 may be bent freely within the maximum curvature radius range of 3 mm, whereby the first ultra-thin film glass substrate 110 may be used as the substrate in the flexible organic light emitting display. As a result, the flexible organic light emitting display 100 according to the embodiment of the present invention may optimize WVTR characteristics by using the specially structured glass substrate and at the same time may be bent effectively.

Also, aluminum silicide 111 ($Al_xSi_y$) exists in the first ultra-thin film glass substrate 110. That is, the first ultra-thin film glass substrate 110 includes aluminum silicide 111. Here, a concentration of the aluminum silicide 111 of the first ultra-thin film glass substrate 110 is higher in an area of this first ultra-thin film glass substrate located farther away from the TFT element 120.

In the flexible organic light emitting display 100 according to the embodiment of the present invention, at least one second adhesive layer (or other functional film or layer having appropriate characteristics) and at least one second ultra-thin film glass substrate (or other material substrate having appropriate characteristics) may be additionally arranged between the first ultra-thin film glass substrate 110 and the TFT element 120. That is, a lower substrate of the flexible organic light emitting display 100 may be configured by a plurality of ultra-thin film glass substrates.

If the lower substrate of the flexible organic light emitting display 100 is configured by a plurality of ultra-thin film glass substrates, the second adhesive layer is arranged appropriately between the plurality of ultra-thin film glass substrates. The first ultra-thin film glass substrate 110 of the plurality of ultra-thin film glass substrates is arranged at the outmost area. That is, the first ultra-thin film glass substrate 110 of the plurality of ultra-thin film glass substrates is arranged to be farthest away from the TFT element 120. Here, the second ultra-thin film glass substrate may not include aluminum silicide 111, which is unlike the first ultra-thin film glass substrate 110. Alternatively, if the second ultra-thin film glass substrate may include aluminum silicide 111 like the first ultra-thin film glass substrate 110, the second ultra-thin film glass substrate may include aluminum silicide 111 of a concentration lower than that of the aluminum silicide 111 included in the first ultra-thin film glass substrate 110. That is, the concentration of the aluminum silicide 111 of the second ultra-thin film glass substrate is equal to 0, or greater than 0 and lower than the concentration of the aluminum silicide 111 included in the first ultra-thin film glass substrate 110.

The TFT element 120 includes a driving TFT for driving the organic light emitting element 130, a switching TFT, various capacitors, and a conductive line connected to the driving TFT and the switching TFT to apply a signal. The switching TFT charges a data voltage in the capacitor in response to a scan pulse. The driving TFT controls the amount of luminescence of the organic light emitting element 130 by controlling the amount of current supplied to the organic light emitting element 130 in accordance with the data voltage charged in the capacitor.

Each of the driving TFT and the switching TFT may be any one of, but not limited to, a-Si TFT, oxide TFT, and LTPS. Also, each of the driving TFT and the switching TFT may be any one of, but not limited to, NMOS, PMOS, and CMOS.

The conductive line may be made of a metal material having low resistance.

Also, an inorganic insulating layer surrounding the conductive line to insulate the conductive line may be arranged in the flexible organic light emitting display 100 according to the embodiment of the present invention. For example, when the flexible organic light emitting display 100 according to the embodiment of the present invention is bent and unbent, an area of the inorganic insulating layer may be minimized so as not to cause any cracks in the inorganic insulating layer and the conductive line. In order to minimize the area of the inorganic insulating layer, the inorganic insulating layer may be patterned at the same pattern as that of the conductive line.

The organic light emitting element 130 includes a first electrode, an organic light emitting layer, and a second electrode.

When a potential of a certain level is applied to the organic light emitting element 130, holes and electrons are injected into the organic light emitting layer by the first electrode and the second electrode. Excitons having a high energy state are generated in the organic light emitting layer by the injected holes and electrons, and light energy is generated as the excitons are transited to a stable energy state.

The first electrode or the second electrode may be a transparent or semi-transparent conductive layer depending on an emission direction of the light energy generated in the organic light emitting element 130.

The flexible organic light emitting display 100 according to the embodiment of the present invention may further include a first adhesive layer 140 arranged below the first ultra-thin film glass substrate 110 and a plastic protective film 150 arranged below the first adhesive layer 140.

The first adhesive layer 140 may be comprised of pressure sensitive adhesive (PSA), for example.

The plastic protective film 150 has flexibility or elasticity, and thus includes a material that may support the first ultra-thin film glass substrate 110 so as not to be damaged when the first ultra-thin film glass substrate 110 is bent. The plastic protective film 150 may be comprised of Polyethyleneterephthalate (PET) or Polyethylenenaphthalate (PEN), for example.

The plastic protective film 150 has an area wider than that of the first ultra-thin film glass substrate 110 which is in contact with the plastic protective film 150 by the first adhesive layer 140. The entire area of the first ultra-thin film glass substrate 110 is fully overlapped (i.e. covered) with the area of the plastic protective film 150 that is wider than the first ultra-thin film glass substrate 110. That is, at least a corner of the plastic protective film 150 which is not overlapped with the first ultra-thin film glass substrate 110 exists. As a result, the first ultra-thin film glass substrate 110 which is vulnerable to external impact and is bent can be effectively and physically protected by the plastic protective film 150. Also, when the first ultra-thin film glass substrate 110 is bent, the plastic protective film 150 provides elasticity to the first ultra-thin film glass substrate 110, whereby the first ultra-thin film glass substrate 110 may be prevented from damage. In order to effectively perform this function, the sum of the thickness of the first adhesive layer 140 and the thickness of the plastic protective film 150 should be greater than the thickness of the first ultra-thin film glass substrate 110.

Also, the flexible organic light emitting display 100 according to the embodiment of the present invention may further include a UV hardening sealant 160 (or other material having appropriate characteristics) arranged on the corner of the plastic protective film 150. The UV hardening sealant 160 may be comprised of resin of which hardening is performed if light energy of UV wavelength area is given thereto.

The UV hardening sealant 160 is arranged on the corner of the plastic protective film 150 to surround the first ultra-thin film glass substrate 110 when viewed on a plane.

Next, a case where an aluminum (Al) based inorganic layer 170 is added to the flexible organic light emitting display 100 according to the embodiment of the present invention shown in FIG. 1 will be described with reference to FIG. 2.

Figure 2:
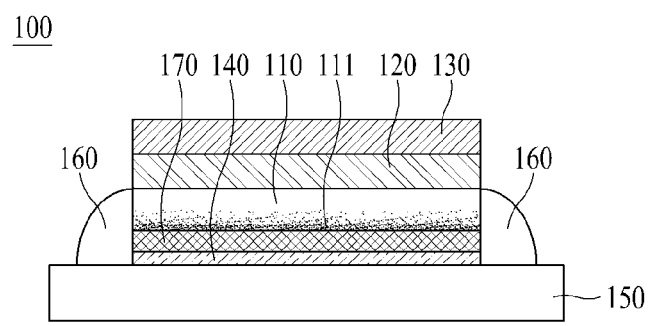

FIG. 2 is a cross-sectional view illustrating a flexible organic light emitting display 100 according to the embodiment of the present invention. In describing the flexible organic light emitting display 100 according to the embodiment of the present invention corresponding to FIG. 2, the description of the same elements as those of the flexible organic light emitting display 100 according to the embodiment of the present invention corresponding to FIG. 1 will be omitted, and elements added to or different from those of the flexible organic light emitting display 100 according to the embodiment of the present invention corresponding to FIG. 1 will be described.

In more detail, as shown in FIG. 2, the flexible organic light emitting display 100 according to the embodiment of the present invention may include a first ultra-thin film glass substrate 110 corresponding to a lower substrate of the flexible organic light emitting display, a TFT element 120 arranged on the first ultra-thin film glass substrate 110, an organic light emitting element 130 arranged on the TFT element 120, and an aluminum (Al) based inorganic layer 170 arranged below the first ultra-thin film glass substrate 110 in direct contact with the first ultra-thin film glass substrate 110.

In this case, the flexible organic light emitting display 100 according to the embodiment of the present invention may be a flexible organic light emitting display in which light energy generated in the organic light emitting element 130 is emitted to an opposite direction of a direction of the first ultra-thin film glass substrate 110, that is, a display direction of the organic light emitting display is towards an upper substrate direction and not towards a lower substrate direction.

The aluminum (Al) based inorganic layer 170 may include aluminum oxide ($Al_xO_y$). The aluminum oxide may be comprised of $Al_2O_3$ only, which is ideally the most stabilized state. However, aluminum oxide may actually exist in the form of AlO, $Al_2O$, etc. as Al is not fully oxidized. In addition to the aluminum oxide, minor unwanted impurities may exist in the inorganic layer 170.

At this time, the flexible organic light emitting display 100 according to an embodiment of the present invention may further include a first adhesive layer 140 arranged below the aluminum (Al) based inorganic layer 170, and a plastic protective film 150 arranged below the first adhesive layer 140. That is, the aluminum (Al) based inorganic layer 170 may be arranged between the first ultra-thin film glass substrate 110 and the first adhesive layer 140.

Next, a case where a third ultra-thin film glass substrate 190 is added to the flexible organic light emitting display 100 according to the embodiment of the present invention shown in FIG. 1 as an upper substrate will be described with reference to FIG. 3.

Figure 3:
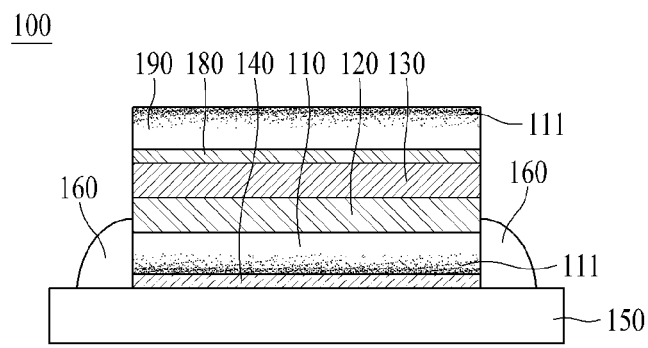

FIG. 3 is a cross-sectional view illustrating a flexible organic light emitting display 100 according to an embodiment of the present invention. In the description of the flexible organic light emitting display 100 according to an embodiment of the present invention corresponding to FIG. 3, description of the same elements as those of the flexible organic light emitting display 100 according to the embodiment of the present invention corresponding to FIG. 1 will be omitted, and elements different from those of the flexible organic light emitting display 100 according to the embodiment of the present invention corresponding to FIG. 1 will be additionally described.

In more detail, as shown in FIG. 3, the flexible organic light emitting display 100 according to the embodiment of the present invention may include a first ultra-thin film glass substrate 110 corresponding to a lower substrate of the flexible organic light emitting display, a TFT element 120 arranged on the first ultra-thin film glass substrate 110, an organic light emitting element 130 arranged on the TFT element 120, a third adhesive layer 180 arranged on the organic light emitting element 130, and a third ultra-thin film glass substrate 190 arranged on the third adhesive layer 180.

The third ultra-thin film glass substrate 190 arranged on the organic light emitting element 130 becomes an upper substrate of the flexible organic light emitting display 100 according to the embodiment of the present invention.

The third ultra-thin film glass substrate 190 may include aluminum silicide 111. That is, the third ultra-thin film glass substrate 190 may not include aluminum silicide 111 unlike the first ultra-thin film glass substrate 110, or may include aluminum silicide 111 like the first ultra-thin film glass substrate 110. If the third ultra-thin film glass substrate 190 includes aluminum silicide 111, the description that the first ultra-thin film glass substrate 110 includes aluminum silicide 111 is equally applied to the third ultra-thin film glass substrate 190. For example, the third ultra-thin film glass substrate 190 has higher concentration of the aluminum silicide 111 in an area located to be far away from the TFT element 120 as shown in FIG. 3.

In the flexible organic light emitting display 100 according to an embodiment of the present invention, at least one second adhesive layer and at least one second ultra-thin film glass substrate may be additionally arranged between the organic light emitting element 130 and the third ultra-thin film glass substrate 190. That is, the upper substrate of the flexible organic light emitting display 100 may be configured by a plurality of ultra-thin film glass substrates.

In this case, the flexible organic light emitting display 100 according to the embodiment of the present invention may be a flexible organic light emitting display in which light energy generated in the organic light emitting element 130 is emitted towards an opposite direction of a direction of the first ultra-thin film glass substrate 110, that is, a display direction of the organic light emitting display is an upper substrate direction not towards a lower substrate direction. At this time, since the second adhesive layer arranged on the upper substrate exists in the display direction of the flexible organic light emitting display 100 according to the embodiment of the present invention, the second adhesive layer may be an Optical Clear Resin (OCR) or an Optical Clear Adhesive (OCA).

If the upper substrate of the flexible organic light emitting display 100 is configured by a plurality of ultra-thin film glass substrates, the third ultra-thin film glass substrate 190 of the plurality of ultra-thin film glass substrates is arranged at the outmost area. That is, the third ultra-thin film glass substrate 190 of the plurality of ultra-thin film glass substrates is arranged to be farthest away from the TFT element 120. The second ultra-thin film glass substrate may not include aluminum silicide 111 unlike the third ultra-thin film glass substrate 190. Alternatively, although the second ultra-thin film glass substrate may include aluminum silicide 111 like the third ultra-thin film glass substrate 190, the second ultra-thin film glass substrate may only include aluminum silicide 111 of a concentration lower than that of the aluminum silicide 111 included in the third ultra-thin film glass substrate 190. That is, the concentration of the aluminum silicide 111 of the second ultra-thin film glass substrate is equal to 0, or greater than 0 and lower than the concentration of the aluminum silicide 111 included in the third ultra-thin film glass substrate 190.

Figure 4:
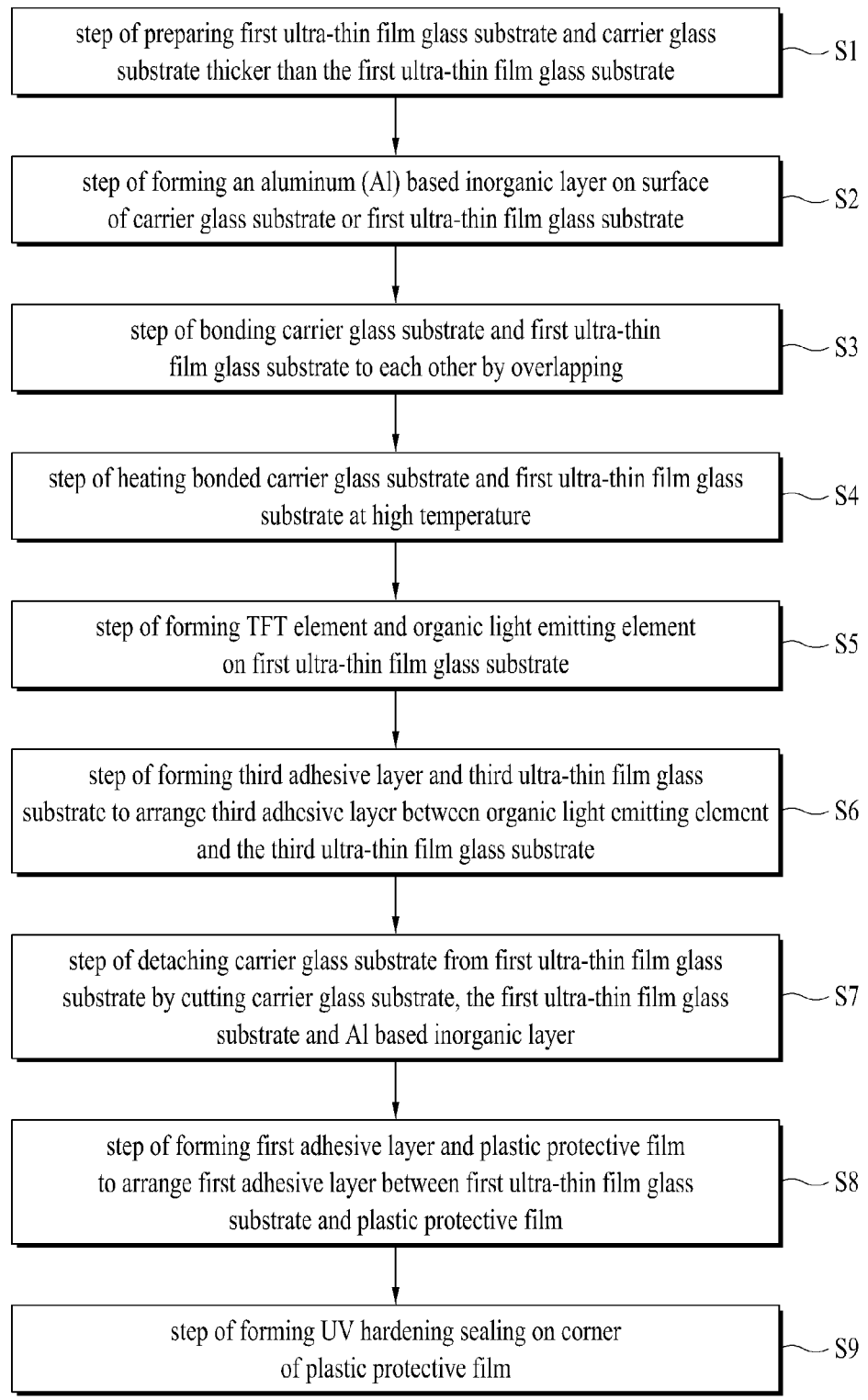
FIG. 4 is a flow chart illustrating a method of fabricating a flexible organic light emitting display according to an embodiment of the present invention.
Figure 5A:
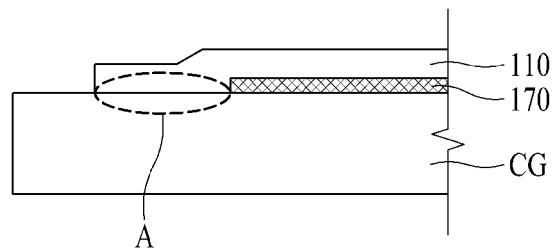
FIGS. 5(a) to 5(f) are cross-sectional views illustrating a method of fabricating a flexible organic light emitting display according to an embodiment of the present invention.
Figure 5B:
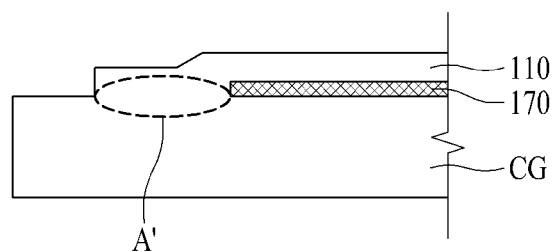
Figure 5C:
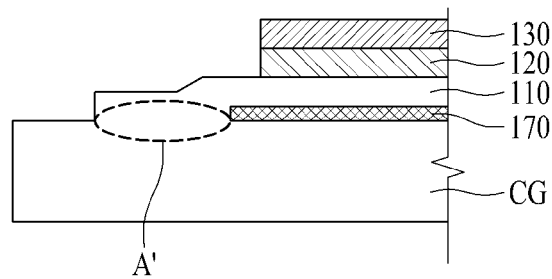
Figure 5D:
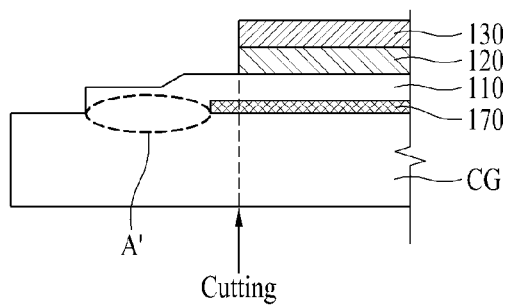
Figure 5E:
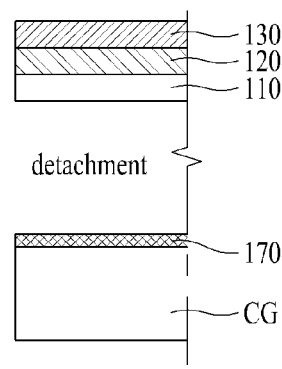
Figure 5F:
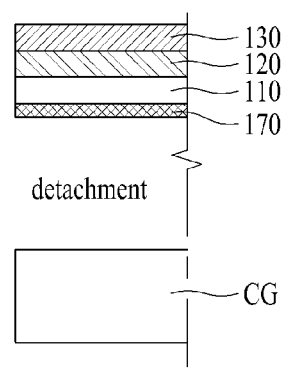

Next, a method of fabricating a flexible organic light emitting display according to the present invention will be described with reference to FIG. 4.

First of all, a step S1 of preparing a first ultra-thin film glass substrate 110 and a carrier glass substrate CG thicker than the first ultra-thin film glass substrate 110 may be performed.

In the step S1 of preparing a first ultra-thin film glass substrate 110 and a carrier glass substrate CG thicker than the first ultra-thin film glass substrate 110, the first ultra-thin film glass substrate 110 is a very thin glass substrate having a thickness of 10 µm to 100 µm. In contrast, the carrier glass substrate CG is a glass substrate having a thickness of 500 µm to 1000 µm, thicker than the first ultra-thin film glass substrate 110 several times or more. The fabricating step may be performed in a state that the first ultra-thin film glass substrate 110 is not bent or damaged by being supported by the carrier glass substrate CG.

The first ultra-thin film glass substrate 110 may be a lower substrate or upper substrate of the flexible organic light emitting display according to the present invention in the step S1 of preparing a first ultra-thin film glass substrate 110 and a carrier glass substrate CG thicker than the first ultra-thin film glass substrate 110. The first ultra-thin film glass substrate 110 which becomes the upper substrate will be referred to as the third ultra-thin film glass substrate 190.

Next, a step S2 of forming an aluminum (Al) based inorganic layer 170 on a surface of the carrier glass substrate CG or the first ultra-thin film glass substrate 110 may be performed.

The aluminum (Al) based inorganic layer 170 may be formed to have an area smaller than that of the first ultra-thin film glass substrate 110.

In the step S2 of forming an aluminum (Al) based inorganic layer 170, the aluminum (Al) based inorganic layer 170 may be formed by any one method of chemical vapor deposition (CVD), Reactive Sputtering and Atomic Layer Deposition (ALD). Particularly, if the aluminum based inorganic layer is formed by ALD, the aluminum based inorganic layer 170 having the lowest surface roughness may be formed as compared with the other methods. In other words, if the aluminum based inorganic layer is formed by ALD, the aluminum based inorganic layer 170 having a smooth surface with little roughness may be formed as compared with the other methods.

At this time, the aluminum based inorganic layer 170 may include aluminum oxide ($Al_xO_y$) in the step S2 of forming an aluminum (Al) based inorganic layer 170.

In the step S2 of forming an aluminum (Al) based inorganic layer 170, chemical vapor deposition (CVD), Reactive Sputtering, or Atomic Layer Deposition (ALD) is performed in such a manner that not precursor or target materials are deposited on a deposited surface but a compound newly generated by a chemical reaction of precursor or target materials is deposited on the deposited surface. In this way, if the precursor or target materials, which include an aluminum (Al), are used, the aluminum (Al) based inorganic layer 170 may be formed. However, as the aluminum (Al) is used as the precursor or target material, the aluminum (Al) may be deposited on the deposited surface in a state that the aluminum (Al) is not oxidized fully during deposition. That is, since deposition is performed continuously in a state that the aluminum (Al) which is not oxidized exists on the deposited surface, the aluminum (Al) which is not oxidized is not likely to be oxidized by oxygen. If the aluminum (Al) which is not oxidized is directly in contact with the carrier glass substrate CG and the first ultra-thin film glass substrate 110, the aluminum (Al) which is not oxidized is diffused into the carrier glass substrate CG and the first ultra-thin film glass substrate 110. The diffused aluminum (Al) is oxidized in the carrier glass substrate CG and the first ultra-thin film glass substrate 110. In this process, the aluminum silicide 111 is generated in the carrier glass substrate CG and the first ultra-thin film glass substrate 110.

Next, a step S3 of bonding the carrier glass substrate CG and the first ultra-thin film glass substrate 110 to each other by overlapping may be performed.

Hereinafter, the step S3 of bonding the carrier glass substrate CG and the first ultra-thin film glass substrate 110 to each other by overlapping will be described with reference to (a) of FIG. 5.

In the step S3 of bonding the carrier glass substrate CG and the first ultra-thin film glass substrate 110 to each other by overlapping, the carrier glass substrate CG and the first ultra-thin film glass substrate 110 are overlapped with each other so that the aluminum (Al) based inorganic layer 170 is arranged between the carrier glass substrate CG and the first ultra-thin film glass substrate 110. Also, the carrier glass substrate CG and the first ultra-thin film glass substrate 110 are overlapped with each other so that a corner of the carrier glass substrate CG is directly in contact with that of the first ultra-thin film glass substrate 110. That is, the carrier glass substrate CG and the first ultra-thin film glass substrate 110 may be bonded to each other by overlapping so that a boundary surface where the corner of the carrier glass substrate CG is directly in contact with that of the first ultra-thin film glass substrate 110 may exist and at the same time the aluminum (Al) based inorganic layer 170 may be arranged between the carrier glass substrate CG and the first ultra-thin film glass substrate 110.

At this time, the step S3 of bonding the carrier glass substrate CG and the first ultra-thin film glass substrate 110 to each other by overlapping is performed in a vacuum state. In this case, the vacuum state includes an abnormal vacuum state that there is no material molecule theoretically and an extremely low pressure state, although not the abnormal vacuum state, lower than an atmospheric pressure. Therefore, the corner of the carrier glass substrate CG may directly be in contact with that of the first ultra-thin film glass substrate 110 without any gap.

A boundary surface between the corner of the carrier glass substrate CG and the corner of the first ultra-thin film glass substrate 110, which are directly in contact with each other, is briefly shown in an oval area of (a) of FIG. 5. The oval area of (a) in FIG. 5 will be defined as a boundary surface A. Hereinafter, the boundary surface A will be described with reference to (a) of FIG. 6.

Generally, a glass substrate has a tetrahedral structure in which four atoms O are covalent bonded to one atom Si, and its surface exists as Si—OH (silanol) unlike its inside. Therefore, the surface of the glass substrate has polarity and hydrophilic property. Referring to (a) of FIG. 6, the carrier glass substrate CG and the first ultra-thin film glass substrate 110 are subjected to a weak hydrogen bond on the boundary surface A by hydroxyl group (—OH) of silanol existing on the surface of each corner of the carrier glass substrate CG and the first ultra-thin film glass substrate 110. It may not be regarded that the carrier glass substrate CG and the first ultra-thin film glass substrate 110 have been substantially integrated with each other on the boundary surface A. It may be regarded that the first ultra-thin film glass substrate 110 is arranged on the carrier glass substrate CG depending on weak gravitation between molecules.

The boundary surface A where such a weak hydrogen bond exists is formed to surround the aluminum (Al) based inorganic layer 170 when viewed on a plane.

In the step S3 of bonding the carrier glass substrate CG and the first ultra-thin film glass substrate 110 to each other by overlapping, as described above, if the aluminum (Al) which is not oxidized is directly in contact with the carrier glass substrate CG and the first ultra-thin film glass substrate 110, the aluminum (Al) which is not oxidized is diffused into the carrier glass substrate CG and the first ultra-thin film glass substrate 110. The diffused Al is oxidized in the carrier glass substrate CG and the first ultra-thin film glass substrate 110. In this process, the aluminum silicide 111 is generated in the carrier glass substrate CG and the first ultra-thin film glass substrate 110.

Therefore, in the step S2 of forming an aluminum (Al) based inorganic layer 170 on a surface of the carrier glass substrate CG or the first ultra-thin film glass substrate 110, the aluminum silicide 111 necessarily exists in first ultra-thin film glass substrate 110 wherever the aluminum (Al) based inorganic layer 170 is formed on the surface of the carrier glass substrate CG or the surface of the first ultra-thin film glass substrate 110. Also, in accordance with the principle of diffusion, the first ultra-thin film glass substrate 110 has the aluminum silicide 111 of which concentration is higher in an area close to the aluminum (Al) based inorganic layer 170 than in any other area. That is, the first ultra-thin film glass substrate 110 has the aluminum silicide 111 of which concentration is higher in an area far away from the TFT element 120.

Next, a step S4 of heating the bonded carrier glass substrate CG and first ultra-thin film glass substrate 110 at a high temperature, for example, equal to or more than 500° C., may be performed.

Hereinafter, the step S4 of heating the bonded carrier glass substrate CG and first ultra-thin film glass substrate 110 at a high temperature will be described with reference to (b) of FIG. 5.

As shown in (b) of FIG. 5, an area where the corner of the carrier glass substrate CG and the corner of the first ultra-thin film glass substrate 110 are integrated with each other by a chemical bond will be referred to as A'. Next, the area A' will be described with reference to (b) of FIG. 6.

Figure 6A:
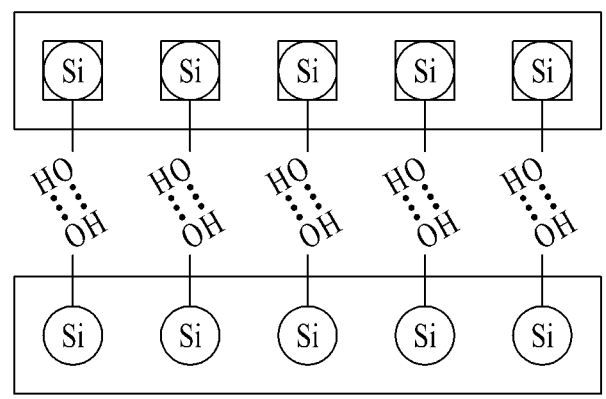
FIGS. 6(a) and 6(b) are mimetic views of a boundary surface A and an area A', which are displayed in a cross-sectional view for illustrating a method of fabricating a flexible organic light emitting display according to an embodiment of the present invention.
Figure 6B:
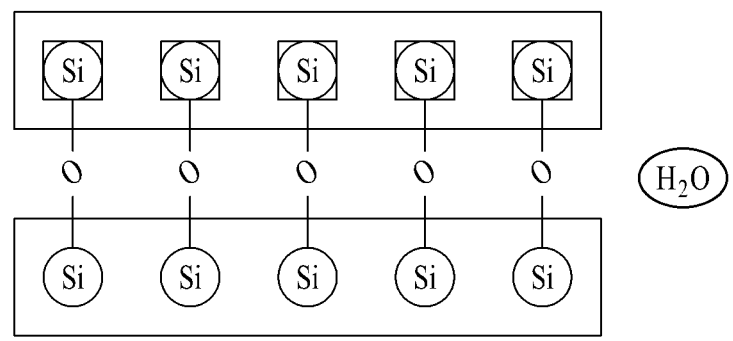

Referring to (b) of FIG. 6, Si—OH (silanol) of the boundary surface A is subjected to a dehydration condensation reaction by heat energy of a high temperature through the step S4 of heating the bonded carrier glass substrate CG and first ultra-thin film glass substrate 110 at a high temperature. Therefore, the boundary surface A is changed to the area A' having a covalent bond structure of —Si—O—Si— where Si at the outmost area of the carrier glass substrate CG is bonded to Si at the outmost area of the first ultra-thin film glass substrate 110 by interposing oxygen (O) therebetween. As a result, the corner of the carrier glass substrate CG and the corner of the first ultra-thin film glass substrate 110 are integrated with each other. That is, the step S4 of heating the bonded carrier glass substrate CG and first ultra-thin film glass substrate 110 at a high temperature is that the carrier glass substrate CG and the first ultra-thin film glass substrate 110 are heated at a temperature for forming a covalent bond through a silanol dehydration condensation reaction on the boundary surface where the carrier glass substrate CG and first ultra-thin film glass substrate 110 are in contact each other. As the chemical bond occurs on the boundary surface A, the carrier glass substrate CG and the first ultra-thin film glass substrate 110 are partially integrated with each other on the area A'.

Therefore, the area A' is formed to surround the aluminum (Al) based inorganic layer 170 when viewed on a plane. The part surrounded by the area A' will be defined as an inner part of the area A'.

At this time, in the step S4 of heating the bonded carrier glass substrate CG and first ultra-thin film glass substrate 110 at a high temperature, for example, equal to or more than 500° C. The heated temperature of the bonded carrier glass substrate CG and first ultra-thin film glass substrate 110 should be higher than a temperature that may generate a silanol dehydration condensation reaction and lower than a temperature that may melt the first ultra-thin film glass substrate 110. Also, the heated temperature of the bonded carrier glass substrate CG and first ultra-thin film glass substrate 110 should be lower than a temperature that may decompose the aluminum (Al) based inorganic layer and the first ultra-thin film glass substrate 110. For example, the bonded carrier glass substrate CG and first ultra-thin film glass substrate 110 may be heated at a high temperature equal to or more than 500° C.

Next, a step S5 of forming a TFT element 120 and an organic light emitting element 130 on the first ultra-thin film glass substrate 110 may be performed.

Hereinafter, the step S5 of forming a TFT element 120 and an organic light emitting element 130 on the first ultra-thin film glass substrate 110 will be described with reference to (c) of FIG. 5.

In the step S5 of forming a TFT element 120 and an organic light emitting element 130 on the first ultra-thin film glass substrate 110, the TFT element 120 and the organic light emitting element 130 are formed inside the area A' at an area smaller than that of the aluminum (Al) based inorganic layer 170 when viewed on a plane.

At this time, in the step S5 of forming a TFT element 120 and an organic light emitting element 130 on the first ultra-thin film glass substrate 110, the first ultra-thin film glass substrate 110 becomes the lower substrate of the flexible organic light emitting display according to the embodiment of the present invention.

Next, a step S6 of forming a third adhesive layer 180 and a third ultra-thin film glass substrate 190 to arrange the third adhesive layer 180 between the organic light emitting element 130 and the third ultra-thin film glass substrate 190 may be performed.

In the step S6 of forming a third adhesive layer 180 and a third ultra-thin film glass substrate 190 to arrange the third adhesive layer 180 between the organic light emitting element 130 and the third ultra-thin film glass substrate 190, the third ultra-thin film glass substrate 190 and the third adhesive layer 180 may be bonded to each other in a state that the third adhesive layer 180 is deposited on the organic light emitting element 130, whereas the organic light emitting element 130 and the third adhesive layer 180 may be bonded to each other in a state that the third adhesive layer 180 is deposited below the third ultra-thin film glass substrate 190.

At this time, in the step S6 of forming a third adhesive layer 180 and a third ultra-thin film glass substrate 190 to arrange the third adhesive layer 180 between the organic light emitting element 130 and the third ultra-thin film glass substrate 190, the third ultra-thin film glass substrate 190 becomes the upper substrate of the flexible organic light emitting display 100 according to the embodiment of the present invention.

At this time, in the step S6 of forming a third adhesive layer 180 and a third ultra-thin film glass substrate 190 to arrange the third adhesive layer 180 between the organic light emitting element 130 and the third ultra-thin film glass substrate 190, the third ultra-thin film glass substrate 190 may not be integrated with the carrier glass substrate CG, or may be integrated with the carrier glass substrate CG by interposing the aluminum (Al) based inorganic layer 170 therebetween. If the third ultra-thin film glass substrate 190 is integrated with the carrier glass substrate CG by interposing the aluminum (Al) based inorganic layer 170 therebetween, the third ultra-thin film glass substrate 190 may include aluminum silicide 111.

That is, in the step S6 of forming a third adhesive layer 180 and a third ultra-thin film glass substrate 190 to arrange the third adhesive layer 180 between the organic light emitting element 130 and the third ultra-thin film glass substrate 190, the third ultra-thin film glass substrate 190 may not include the aluminum silicide 111, or may include the aluminum silicide 111. If the third ultra-thin film glass substrate 190 includes the aluminum silicide 111, in accordance with the principle of diffusion, the third ultra-thin film glass substrate 190 has the aluminum silicide 111 of which concentration is higher in an area close to the aluminum (Al) based inorganic layer 170 than in any other area. That is, the third ultra-thin film glass substrate 190 has the aluminum silicide 111 of which concentration is higher in an area far away from the TFT element 120.

Next, a step S7 of detaching a carrier glass substrate CG from a first ultra-thin film glass substrate 110 by cutting the carrier glass substrate CG, the first ultra-thin film glass substrate 110 and the aluminum (Al) based inorganic layer 170 may be performed.

Hereinafter, in the step S7 of detaching a carrier glass substrate CG from a first ultra-thin film glass substrate 110 by cutting the carrier glass substrate CG, the first ultra-thin film glass substrate 110 and the aluminum (Al) based inorganic layer 170, the cutting step will be described with reference to (d) of FIG. 5.

Referring to (d) of FIG. 5, in the step S7 of detaching a carrier glass substrate CG from a first ultra-thin film glass substrate 110 by cutting the carrier glass substrate CG, the first ultra-thin film glass substrate 110 and the aluminum (Al) based inorganic layer 170, the cutting process is performed for the inside of the area A'. That is, cutting is performed for a point where the carrier glass substrate CG, the first ultra-thin film glass substrate 110 and the aluminum (Al) based inorganic layer 170 are deposited in a shape of a sandwich.

Also, in the step S7 of detaching a carrier glass substrate CG from a first ultra-thin film glass substrate 110 by cutting the carrier glass substrate CG, the first ultra-thin film glass substrate 110 and the aluminum (Al) based inorganic layer 170 inside the area A', the detaching process will be described with reference to (e) and (f) of FIG. 5.

It is supposed that the aluminum (Al) based inorganic layer 170 is formed on the surface of the carrier glass substrate CG in the step S2 of forming an aluminum (Al) based inorganic layer 170 on a surface of the carrier glass substrate CG or the first ultra-thin film glass substrate 110. At this time, if the step S7 of detaching the carrier glass substrate CG from the first ultra-thin film glass substrate 110 is performed, as shown in (e) of FIG. 5, the aluminum (Al) based inorganic layer 170 remains on the surface of the carrier glass substrate CG. In other words, the aluminum (Al) based inorganic layer 170 and the carrier glass substrate CG are together detached from the first ultra-thin film glass substrate 110. This is equally applied to the upper substrate even in the case that the upper substrate is the third ultra-thin film glass substrate 190 integrated with the carrier glass substrate CG by interposing the aluminum (Al) based inorganic layer 170 therebetween.

In contrast, it is supposed that the aluminum (Al) based inorganic layer 170 is formed on the surface of the first ultra-thin film glass substrate 110 in the step S2 of forming an aluminum (Al) based inorganic layer 170 on a surface of the carrier glass substrate CG or the first ultra-thin film glass substrate 110. At this time, if the step S7 of detaching the carrier glass substrate CG from the first ultra-thin film glass substrate 110 is performed, as shown in (f) of FIG. 5, the aluminum (Al) based inorganic layer 170 remains on the surface of the first ultra-thin film glass substrate 110. In other words, the aluminum (Al) based inorganic layer 170 and the first ultra-thin film glass substrate 110 are together detached from the carrier glass substrate CG. This is equally applied to the upper substrate even in the case that the upper substrate is the third ultra-thin film glass substrate 190 integrated with the carrier glass substrate CG by interposing the aluminum (Al) based inorganic layer 170 therebetween.

At this time, in the step S6 of forming a third adhesive layer 180 and a third ultra-thin film glass substrate 190 to arrange the third adhesive layer 180 between the organic light emitting element 130 and the third ultra-thin film glass substrate 190, if the third ultra-thin film glass substrate 190 is integrated with the carrier glass substrate CG by interposing the aluminum (Al) based inorganic layer 170 therebetween, the step of cutting the carrier glass substrate CG and the third ultra-thin film glass substrate 190 and detaching them from each other, which is the same as the step S7 of detaching the carrier glass substrate CG from the first ultra-thin film glass substrate 110, should be performed. That is, the cutting and detaching process should be performed for the third ultra-thin film glass substrate 190 as the upper substrate as well as the first ultra-thin film glass substrate 110 as the lower substrate.

Next, a step S8 of forming a first adhesive layer 140 and a plastic protective film 150 to arrange the first adhesive layer 140 between the first ultra-thin film glass substrate 110 and the plastic protective film 150 may be performed.

At this time, in the step S8 of forming a first adhesive layer 140 and a plastic protective film 150 to arrange the first adhesive layer 140 between the first ultra-thin film glass substrate 110 and the plastic protective film 150, the first adhesive layer 140 may be comprised of a pressure sensitive adhesive (PSA), for example, and the plastic protective film 150 may be comprised of Polyethyleneterephthalate (PET), Polyethylenenaphthalate (PEN), etc.

At this time, in the step S8 of forming a first adhesive layer 140 and a plastic protective film 150 to arrange the first adhesive layer 140 between the first ultra-thin film glass substrate 110 and the plastic protective film 150, the first ultra-thin film glass substrate 110 and the plastic protective film 150 may be bonded to each other in a state that the first adhesive layer 140 is deposited below the first ultra-thin film glass substrate 110, whereas the first ultra-thin film glass substrate 110 and the plastic protective film 150 may be bonded to each other in a state that the first adhesive layer 140 is deposited on the plastic protective film 150.

At this time, in the step S8 of forming a first adhesive layer 140 and a plastic protective film 150 to arrange the first adhesive layer 140 between the first ultra-thin film glass substrate 110 and the plastic protective film 150, the plastic protective film 150 has an area wider than that of the first ultra-thin film glass substrate 110, which is in contact with the plastic protective film 150 by the first adhesive layer 140. Therefore, a corner of the plastic protective film 150, which does not correspond to the first ultra-thin film glass substrate 110, exists.

At this time, in the step S8 of forming a first adhesive layer 140 and a plastic protective film 150 to arrange the first adhesive layer 140 between the first ultra-thin film glass substrate 110 and the plastic protective film 150, sum of a thickness of the first adhesive layer 140 and a thickness of the plastic protective film 150 may be thicker than a thickness of the first ultra-thin film glass substrate 110.

Next, a step S9 of forming a UV hardening sealant 160 on a corner of a plastic protective film 150 may be performed.

At this time, in the step S9 of forming a UV hardening sealant 160 on a corner of a plastic protective film 150, the UV hardening sealant 160 may be comprised of resin which is hardened if light energy of a UV wavelength area is given thereto.

At this time, in the step S9 of forming a UV hardening sealant 160 on a corner of a plastic protective film 150, the UV hardening sealant 160 may be formed to surround the corner of the plastic protective film 150 in a jetting manner. As described above, the area of the plastic protective film 150 is wider than that of the first ultra-thin film glass substrate 110 which is in contact with the plastic protective film 150 by the first adhesive layer 140. Therefore, the corner of the plastic protective film 150, which does not correspond to the first ultra-thin film glass substrate 110, exists. As the UV hardening sealant 160 is formed on the corner of the plastic protective film 150, which does not correspond to the first ultra-thin film glass substrate 110, lateral step difference of the flexible organic light emitting display 100 according to the embodiment of the present invention is compensated. Particularly, since the flexible organic light emitting display 100 according to the embodiment of the present invention may be bent, physical coupling of elements should be maintained as it is when the flexible organic light emitting display 100 is bent and unbent. Therefore, the UV hardening sealant 160 may be formed to be directly in contact with all sides of the first ultra-thin film glass substrate 110 to effectively support coupling of the elements while compensating for step difference of the flexible organic light emitting display 100 according to the embodiment of the present invention. That is, the UV hardening sealant 160 may be formed to surround all sides of the first ultra-thin film glass substrate 110.

At this time, in the step S9 of forming a UV hardening sealant 160 on a corner of a plastic protective film 150, the UV hardening sealant 160 may be hardened by LED lamp that irradiates UV having a wavelength in the range of 350 nm to 390 nm.

The aforementioned steps and their order, which are suggested to describe the method of fabricating the flexible organic light emitting display 100 according to the embodiment of the present invention, are only exemplary, and the steps may be performed simultaneously or their order may be changed to fabricate the flexible organic light emitting display 100 according to the embodiment of the present invention.

According to the flexible organic light emitting display 100 according to the embodiment of the present invention and the method of fabricating the same as described above, the flexible organic light emitting display may be realized without use of a plastic based substrate.

Also, as a plastic based substrate is not used for the flexible organic light emitting display 100 according to an embodiment of the present invention, various barriers for preventing oxygen and water, which are factors for deteriorating the organic light emitting element 130, from being permeated into the organic light emitting element 130 may not be used, whereby a slim sized display may be fabricated.

Also, as a glass substrate is used for the flexible organic light emitting display 100 according to the embodiment of the present invention, an ideal WVTR characteristic level for stably driving the organic light emitting element 130 may be realized.

As a result, in the flexible organic light emitting display 100 according to an embodiment of the present invention, a defect ratio during the fabricating process may be lowered and lifetime of the display may be improved as compared with the related art.

It will be apparent to those skilled in the art that various modifications and variations can be made in the present invention without departing from the scope of the inventions. Thus, it is intended that the present invention covers the modifications and variations of this invention provided they come within the scope of the appended claims and their equivalents.

What is claimed is:

1. A flexible organic light emitting display comprising:
    a first ultra-thin film glass substrate including aluminum silicide;
    a thin film transistor (TFT) element on the first ultra-thin film glass substrate; and
    an organic light emitting element on the TFT element,
    wherein the aluminum silicide of the first ultra-thin film substrate has a higher concentration in an area of the first ultra-thin film glass substrate farther away from the TFT element than in any other area.

2. The flexible organic light emitting display of claim 1, further comprising an aluminum based inorganic layer below the first ultra-thin film glass substrate and directly in contact with the first ultra-thin film glass substrate.

3. The flexible organic light emitting display of claim 2, wherein the aluminum based inorganic layer includes aluminum oxide.

4. The flexible organic light emitting display of claim 2, further comprising:
    a first adhesive layer arranged below the first ultra-thin film glass substrate; and
    a plastic protective film below the first adhesive layer.

5. The flexible organic light emitting display of claim 4, wherein a sum of a thickness of the first adhesive layer and a thickness of the plastic protective film is greater than a thickness of the first ultra-thin film glass substrate.

6. The flexible organic light emitting display of claim 5, wherein the plastic protective film has an area wider than that of the first ultra-thin film glass substrate.

7. The flexible organic light emitting display of claim 5, further comprising a UV hardening sealant on a corner of the plastic protective film, so as to be directly in contact with all sides of the first ultra-thin film glass substrate.

8. The flexible organic light emitting display of claim 5, wherein the first ultra-thin film glass substrate is capable of being bent within a maximum curvature radius range of 3 mm with the first ultra-thin film glass substrate bonded to the first adhesive layer and to the plastic protective film.

9. The flexible organic light emitting display of claim 1, further comprising:
    at least one second adhesive layer on the first ultra-thin film glass substrate; and
    at least one second ultra-thin film glass substrate.

10. The flexible organic light emitting display of claim 9, wherein the second ultra-thin film glass substrate includes aluminum silicide of which concentration is equal to 0, or is greater than 0 and lower than a concentration of aluminum silicide included in the first ultra-thin film glass substrate.

11. The flexible organic light emitting display of claim 1, further comprising:
    a third adhesive layer on the organic light emitting element; and
    a third ultra-thin film glass substrate on the third adhesive layer.

12. The flexible organic light emitting display of claim 11, wherein the third ultra-thin film glass substrate includes aluminum silicide of which concentration is higher in an area relatively far away from the TFT element than in any other area.

13. The flexible organic light emitting display of claim 12, further comprising:
    at least one second adhesive layer; and
    at least one second ultra-thin film glass substrate between the organic light emitting element and the third ultra-thin film glass substrate.

14. The flexible organic light emitting display of claim 13, wherein the second ultra-thin film glass substrate includes aluminum silicide of which concentration is equal to 0, or is greater than 0 and lower than a concentration of aluminum silicide included in the third ultra-thin film glass substrate.

15. The flexible organic light emitting display of claim 1, wherein the TFT element includes a driving TFT, a switching TFT, a capacitor, a conductive line patterned by being connected to the driving TFT and the switching TFT, and an inorganic insulating layer between the first ultra-thin film glass substrate and the conductive line, and the inorganic insulating layer is patterned at the same pattern as that of the conductive line.

16. An apparatus comprising:
    a substrate comprising at least one ultra-thin film glass layer having a thickness of approximately 40 µm; and
    a protective film attached to said substrate via an adhesive layer,
    wherein said substrate, said adhesive layer and said protective film all attached together exhibit a maximum curvature radius range of 3 mm and configured to exhibit particular encapsulation characteristics based on specific water vapor transmission rate (WVTR) values without requiring any multi-buffer or barrier layer attached to said substrate.

17. The apparatus of claim 16 wherein said ultra-thin film glass layer includes aluminum silicide, whereby said aluminum silicide has increased concentration towards a lower surface thereof.

18. The apparatus of claim 17, wherein said ultra-thin film glass layer is part of a flexible organic light emitting display.

* * * * *